(12) United States Patent
Hou et al.

(10) Patent No.: US 7,880,540 B2
(45) Date of Patent: Feb. 1, 2011

(54) AMPLIFYING SYSTEM AND RELATED METHOD

(75) Inventors: Chun-Chih Hou, Tainan County (TW); Yin-Chao Huang, Taipei Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 39 days.

(21) Appl. No.: 12/390,514

(22) Filed: Feb. 23, 2009

(65) Prior Publication Data

US 2010/0214023 A1 Aug. 26, 2010

(51) Int. Cl.
*H03F 1/14* (2006.01)

(52) U.S. Cl. ........................................... 330/51

(58) Field of Classification Search ................... 330/51, 330/207 P, 298
See application file for complete search history.

(56) References Cited

U.S. PATENT DOCUMENTS

| 4,181,895 | A | 1/1980 | Yoshida |
| 7,265,614 | B2 * | 9/2007 | Chang et al. ................... 330/51 |
| 7,525,387 | B2 * | 4/2009 | Kazi et al. ................... 330/296 |

* cited by examiner

*Primary Examiner*—Robert Pascal
*Assistant Examiner*—Khiem D Nguyen
(74) *Attorney, Agent, or Firm*—Winston Hsu; Scott Margo

(57) ABSTRACT

An amplifying system includes an amplifier operated according to a supply voltage, and a detector coupled to the amplifier for generating a first control signal to the amplifier to disable an output stage of the amplifier when the supply voltage reaches a threshold.

17 Claims, 5 Drawing Sheets

AMPLIFYING SYSTEM AND RELATED METHOD

BACKGROUND

The present invention relates to an audio amplifying system and related method, and more particularly to an audio amplifying system having an improved glitch performance, and a method thereof.

In an audio system, a speaker is coupled to an audio amplifier to broadcast an audio signal generated by the audio amplifier as shown in FIG. 1. FIG. 1 is a diagram illustrating a conventional audio system 10. The conventional audio system 10 comprises an amplifier 11, a capacitor 12, a power-off detecting module 13, and a speaker 14. The amplifier 11 is operable between a supply voltage Vdd and a ground voltage Vgnd, and the amplifier 11 amplifies an input signal Vin to output an output signal Vout. The capacitor 12 is coupled between the amplifier 11 and the speaker 14 for filtering the DC level of the output signal Vout and outputting an output AC signal Vac to the speaker 14. In addition, the power-off detecting module 13 is coupled to a terminal N1, which is the terminal between the capacitor 12 and the speaker 14, for clamping the voltage level at the terminal N1 to the ground voltage Vgnd when the supply voltage Vdd is turned off to eliminate the pop-noise generated at an output terminal N2 of the amplifier 11. The power-off detecting module 13 comprises a power-off detector 13a and a bipolar junction transistor 13b. The power-off detector 13a turns on the bipolar junction transistor 13b to clamp the voltage level at the terminal N1 to the ground voltage Vgnd when it detects that the supply voltage Vdd drops to a specific voltage level.

In addition, the voltage level at the output terminal N2 of the amplifier 11 always has a close relationship with the voltage level of the supply voltage Vdd. For example, if the voltage level of the supply voltage Vdd drops sharply, the voltage level at the output terminal N2 drops sharply too. Then, when the voltage level at the output terminal N2 of the amplifier 11 drops to the ground voltage Vgnd too sharply, and the power-off detector 13a is too late to turn on the power-off detector 13a to clamp the voltage level at the terminal N1 to the ground voltage Vgnd, a glitch signal is generated at the terminal N1. The glitch signal is amplified and outputted as the pop-noise. Therefore, providing a more efficient way to eliminate the pop-noise generated by an amplifier is a significant concern in an audio system.

SUMMARY OF THE INVENTION

One of the objectives of the present invention is to provide an audio amplifying system having an improved glitch performance, and a related method.

According to an embodiment of the present invention, an amplifying system is provided. The amplifying system comprises an amplifier, and a detector. The amplifier is operated according to a supply voltage. The detector is coupled to the amplifier and is configured to generate a first control signal to the amplifier to disable an output stage of the amplifier when detecting that the supply voltage reaches a threshold.

According to a second embodiment of the present invention, a method for enhancing a glitch performance of an amplifier system is provided, wherein the amplifier is operated according to a supply voltage. The method comprises the steps of: detecting an operating status of the amplifier; and when detecting that the supply voltage reaches a threshold, disabling an output stage of the amplifier.

According to a third embodiment of the present invention, an amplifying system is provided. The amplifying system comprises an amplifier operated according to a supply voltage, and a detector coupled to the amplifier, for adjusting an output signal of the amplifier when the supply voltage reaches a threshold. The amplifier and the detector are configured in a single chip.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
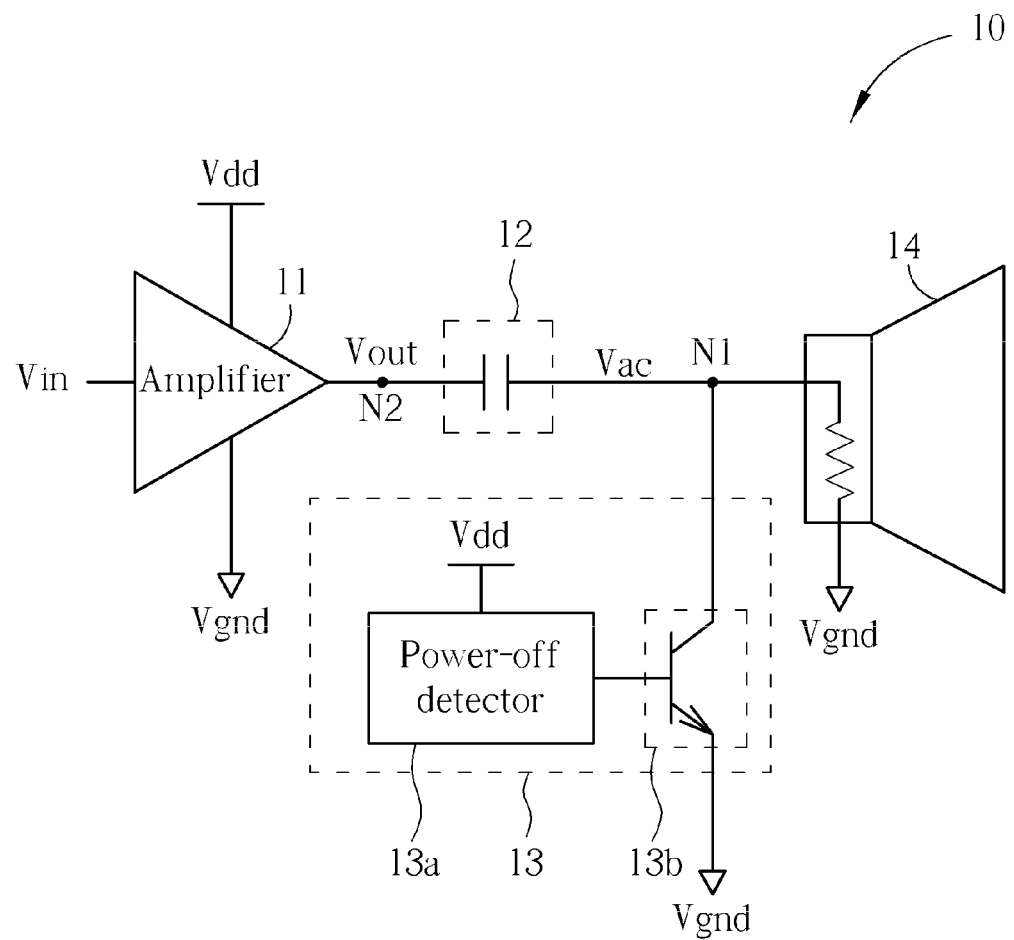
FIG. 1 is a diagram illustrating a conventional audio system.
Figure 2:
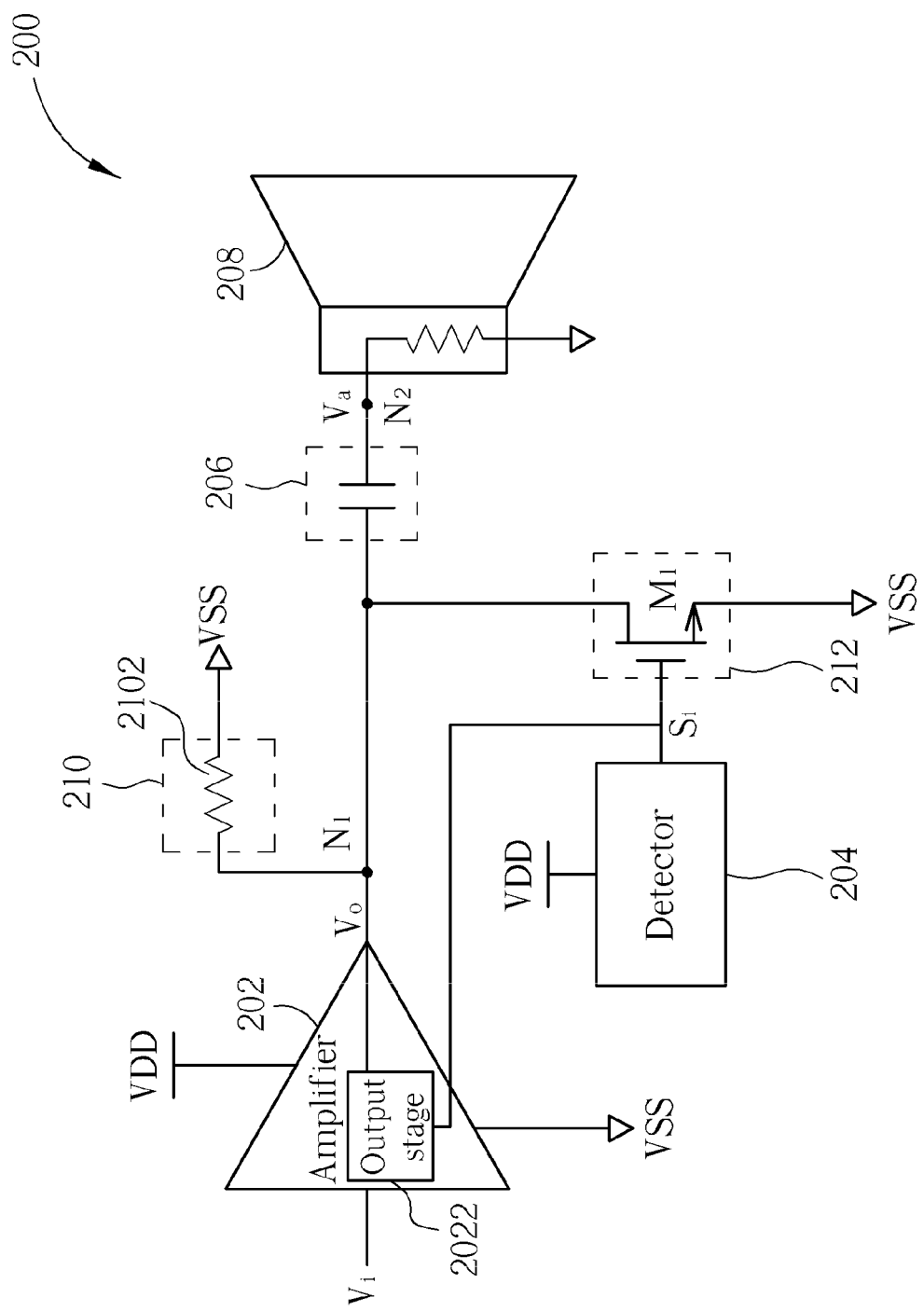
FIG. 2 is a diagram illustrating an amplifying system according to an embodiment of the present invention.

Please refer to FIG. 2. FIG. 2 is a diagram illustrating an amplifying system 200 according to an embodiment of the present invention. The amplifying system 200 comprises an amplifier 202, a detector 204, a capacitive device 206, an audio playback device 208, a first auxiliary circuit 210, and a second auxiliary circuit 212. The first auxiliary circuit 210, the second auxiliary circuit 212, the detector 204, and the amplifier 202 are configured in a single chip. The amplifier 202 is operated between a first supply voltage VDD and a second supply voltage VSS. The detector 204 is coupled to the amplifier 202 for adjusting the output signal of the amplifier 202 when the first supply voltage VDD reaches a threshold $V_{th}$. In one embodiment, the detector 204 generates a first control signal $S_1$ to the amplifier 202 to disable an output stage 2022 of the amplifier 202 when the first supply voltage VDD reaches the threshold $V_{th}$. The capacitive device 206, which is external to the single chip, has a first terminal $N_1$ coupled to the output terminal of the output stage 2022 in the amplifier 202. The audio playback device 208 (e.g., a speaker) is external to the single chip and coupled to a second terminal $N_2$ of the capacitive device 206. The detector 204 may detect the voltage level of the first supply voltage VDD and determine whether it reaches the threshold $V_{th}$, or may receive an indication or control signal from other detecting circuits (not shown in the figure) that detect the first supply voltage VDD. Moreover, it should be noted that the detector 204 is not limited to detect the threshold $V_{th}$ to determine the operating status of the amplifier 202. In another embodiment of the present invention, the detector 204 may detect the voltage range between the first supply voltage VDD and the second supply voltage VSS to determine the operating status of the amplifier 202.

In this embodiment, the first auxiliary circuit 210 and the second auxiliary circuit 212 are coupled between the output terminal of the output stage 2022 in the amplifier 210 and a specific voltage level, for increasing a leakage current at the output terminal so as to speed up the ramp-down of the output signal $V_o$ when the output stage 2022 of the amplifier 202 is disabled. Please note that the specific voltage level is set to the second supply voltage VSS in this embodiment for simplicity of explanation, but this is not meant to be a limitation of the present invention. It should be noted that the first auxiliary circuit 210 is implemented by a resistive element 2102 in this embodiment, and the resistive element 2102 may be a parasitic resistor or a semiconductor resistor in the single chip. The second auxiliary circuit 212 is an on/off switch implemented by an N-type field effect transistor $M_1$. Therefore, the first control signal $S_1$ is also coupled to the gate terminal of the N-type field effect transistor $M_1$ for controlling the N-type field effect transistor $M_1$. The drain terminal of the N-type field effect transistor $M_1$ is coupled to the output terminal of the output stage 2022 in the amplifier 202, and the source terminal of the N-type field effect transistor $M_1$ is coupled to the specific voltage level. Please note that the present invention is not limited to utilizing both the first auxiliary circuit 210 and the second auxiliary circuit 212 in the amplifying system 200. A person with ordinary skill in the art should appreciate that either the first auxiliary circuit 210 or the second auxiliary circuit 212 may achieve the similar effect illustrated in the following paragraphs. In addition, a person with ordinary skill in the art should also appreciate that to decrease the on-resistance of N-type field effect transistor $M_1$, a resistor may be installed between the drain of N-type field effect transistor $M_1$ and the first terminal $N_1$, which also belongs to the scope of the present invention.

Figure 3:
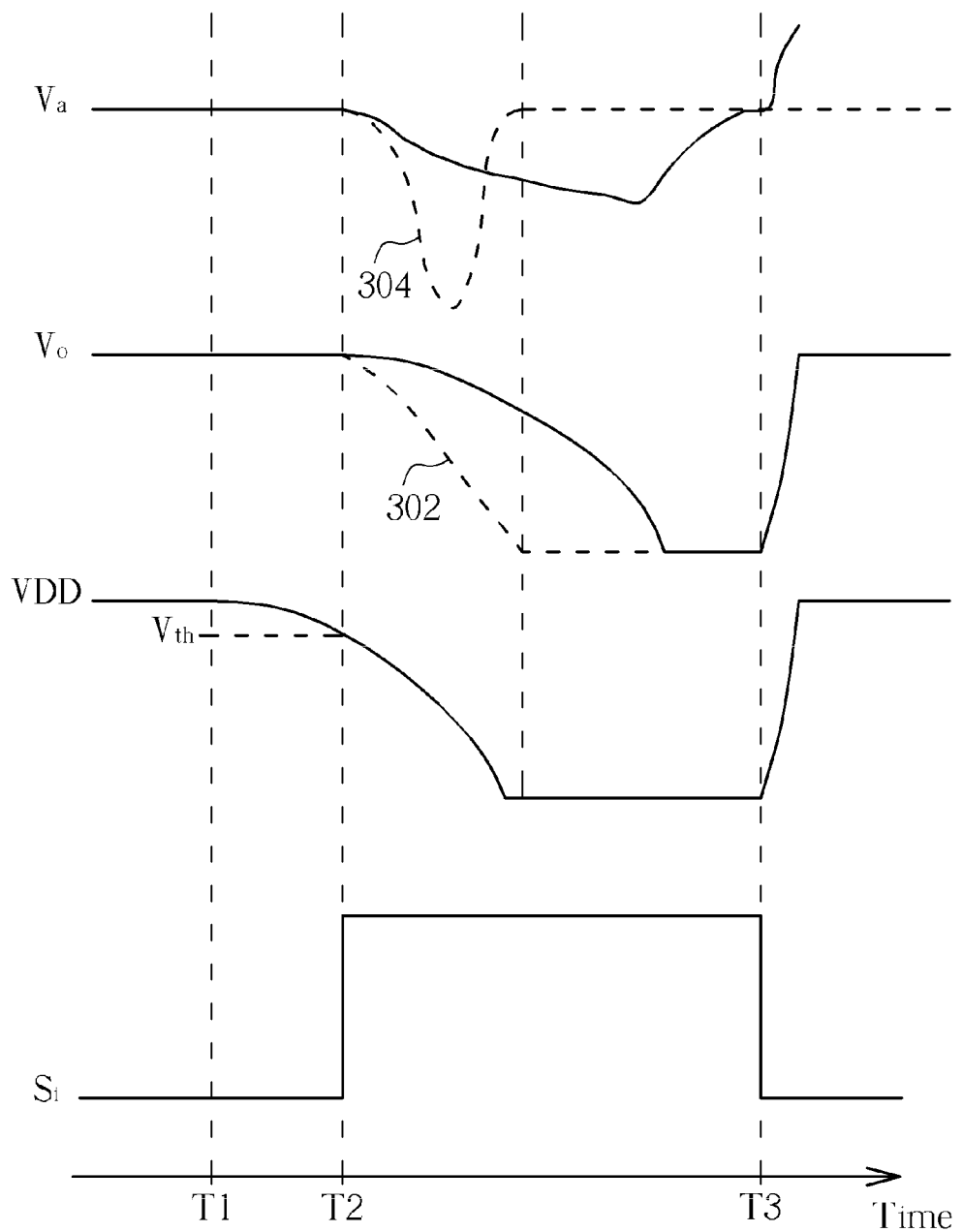
FIG. 3 is a timing diagram illustrating a first supply voltage, an output signal, an output AC signal, and a first control signal of the amplifying system operated under a normal operation mode and a shut down mode.

When the amplifying system 200 operates under a normal operation mode, the amplifier 202 amplifies an input signal $V_i$ to output an output signal $V_o$. The capacitive device 206 filters the DC level of the output signal $V_o$ and outputs an output AC signal $V_a$ corresponding to the output signal $V_o$ to the audio playback device 208. On the other hand, when the amplifying system 200 is going to leave the normal operation mode and to enter a shut down mode, the first supply voltage VDD of the amplifier 202 decreases gradually to turn off the amplifier 202 as shown in FIG. 3. FIG. 3 is a timing diagram illustrating the first supply voltage VDD, the output signal $V_o$, the output AC signal $V_a$, and the first control signal $S_1$ of the amplifying system 200 operated under both the normal operation mode and the shut down mode. The amplifying system 200 operates under the normal operation mode before the time T1 and after the time T3, and the amplifying system 200 operates under the shut down mode between the time T1 and the time T3. At time T1, the first supply voltage VDD is disconnected from power supply such that the amplifying system 200 enters the shut down mode from the normal operation mode. After the time T1, the first supply voltage VDD decreases gradually. The detector 204 detects that the first supply voltage VDD reaches the threshold $V_{th}$ at time T2, and generates the first control signal $S_1$ (i.e., generates a high voltage level as shown in FIG. 3) to disable the output stage 2022 of the amplifier 202 and, at the same time, to turn on the N-type field effect transistor $M_1$. When the output stage 2022 of the amplifier 202 is disabled, the output terminal of the output stage 2022 (i.e., the first terminal $N_1$) becomes floating, which means that the voltage level at the output terminal (i.e., the output signal $V_o$) of the amplifier 202 is independent from the voltage level of the supply voltage VDD. Therefore, after time T2, the electric charge trapped in the output terminal of the amplifier 202 is discharged by the resistive element 2102 and the N-type field effect transistor $M_1$. Please note that, in another embodiment of the present invention, either the resistive element 2102 or the N-type field effect transistor $M_1$ is utilized for discharging the electric charge trapped in the output terminal of the amplifier 202.

Therefore, the slope of decreasing the voltage level at the output terminal (i.e., the output signal $V_o$) of the amplifier 202 can be controlled by the N-type field effect transistor $M_1$ in conjunction with the resistive element 2102. More specifically, through the adjustment of the size (i.e., width/length) of the N-type field effect transistor $M_1$ and the resistance of the resistive element 2102, the output signal $V_o$ can be discharged to be substantially equal to the second supply voltage VSS, which may be a ground voltage, before the amplifying system 200 enters the normal operation mode again, i.e., at time T3. Accordingly, the glitch of the output AC signal $V_a$ is reduced smoothly in the time interval between T2 and T3. On the other hand, the voltage level of the supply voltage VDD decreases to the second supply voltage VSS, i.e., the ground voltage, in a relatively steep way, which is nothing to do with the slope of the voltage level at the output terminal of the amplifier 202 since the output stage 2022 is disabled in the time interval between T2 and T3.

Please note that, to describe the spirit of the present invention more clearly, a first dashed line 302 representing the voltage level at the output terminal N2 of the conventional audio system 10 is illustrated in FIG. 3. A second dashed line 304 representing the glitch signal, which generates the above-mentioned pop-noise, of the conventional audio system 10 is also illustrated in FIG. 3. It should be noted that the occurrence of the glitch signal is caused by the steep slope of the first dashed line 302. Therefore, by moderating the slope of the output signal $V_o$ of the amplifier 202, the glitch signal that emerges in the conventional audio system 10 can be dealt with.

Figure 4:
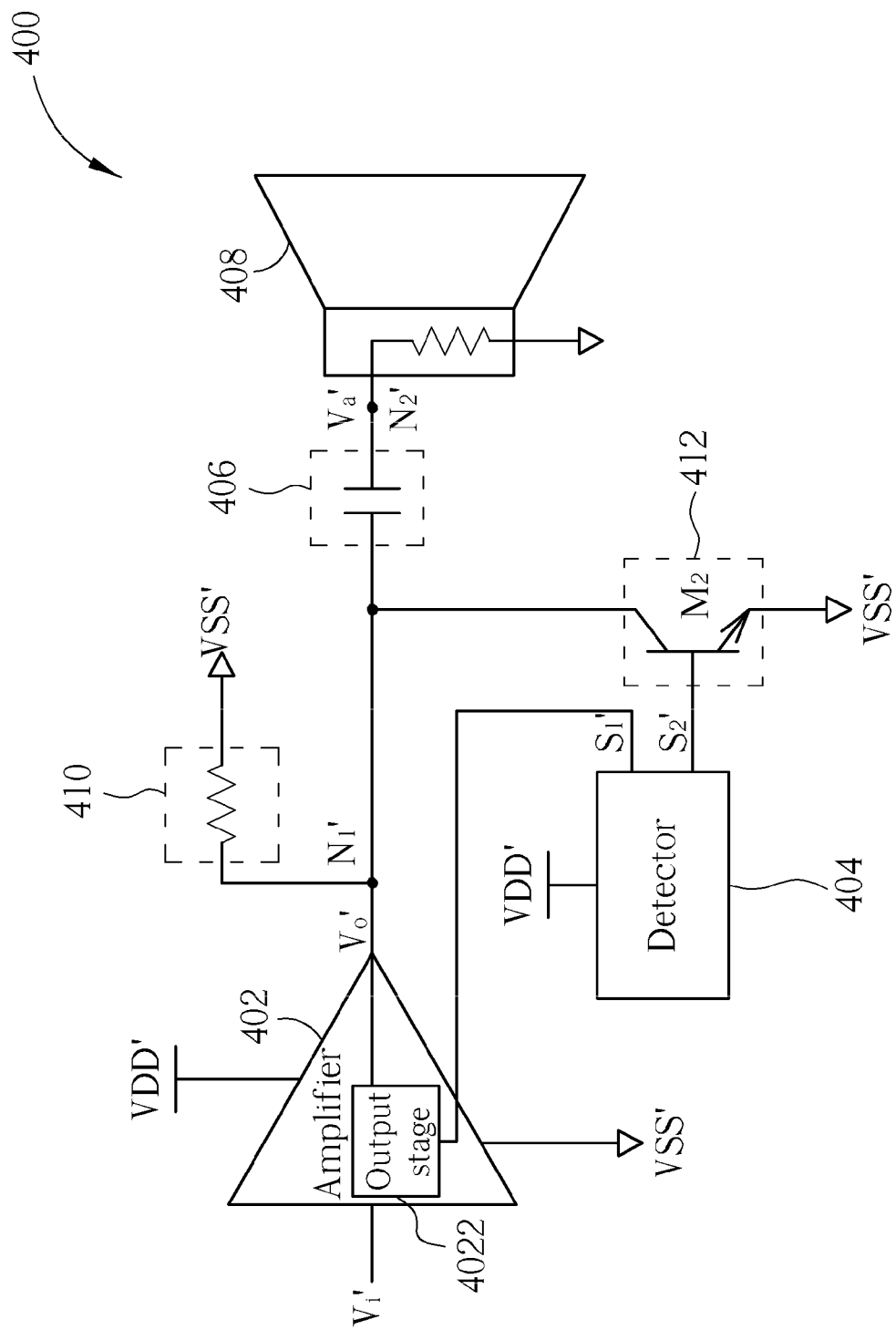
FIG. 4 is a diagram illustrating an amplifying system according to a second embodiment of the present invention.

Please refer to FIG. 4. FIG. 4 is a diagram illustrating an amplifying system 400 according to a second embodiment of the present invention. Similar to the first embodiment shown in FIG. 2, the first auxiliary circuit 410 and the second auxiliary circuit 412 are coupled between the output terminal of the output stage 4022 in the amplifier 410 and a specific voltage level, for increasing a leakage current at the output terminal when the output stage 4022 of the amplifier 402 is disabled. However, the second auxiliary circuit 412 is implemented by an N-type bipolar junction transistor $M_2$. Therefore, a second control signal $S_2'$, which is generated by the detector 404, is coupled to the gate terminal of the N-type bipolar junction transistor $M_2$ for controlling the N-type bipolar junction transistor $M_2$. The collector of the N-type bipolar junction transistor $M_2$ is coupled to the output terminal of the output stage 4022 in the amplifier 402, and the emitter of the N-type bipolar junction transistor $M_2$ is coupled to the specific voltage level. Please note that the present invention is not limited to utilizing both the first auxiliary circuit 410 and the second auxiliary circuit 412 in the amplifying system 400.

Compared to the amplifying system 200 shown in FIG. 2, the second auxiliary circuit 412 of the amplifying system 400 is implemented by the N-type bipolar junction transistor $M_2$. Since the first control signal $S_1'$ controlling the output stage 4022 of the amplifier 402 may be a voltage signal, and the second control signal $S_2'$ controlling the N-type bipolar junction transistor $M_2$ may be a current signal, the amplifier 402 and the second auxiliary circuit 412 do not share the same control signal, unlike the first embodiment. However, a person with ordinary skill in the art should appreciate that the first control signal $S_1'$ and the second control signal $S_2'$ may have the same control timing as the first control signal $S_1$ of the amplifying system 200. A detailed description is omitted here for brevity. In addition, a person with ordinary skill in the art should appreciate that the amplifying system 400 can achieve similar or the same advantages as the amplifying system 200.

Figure 5:
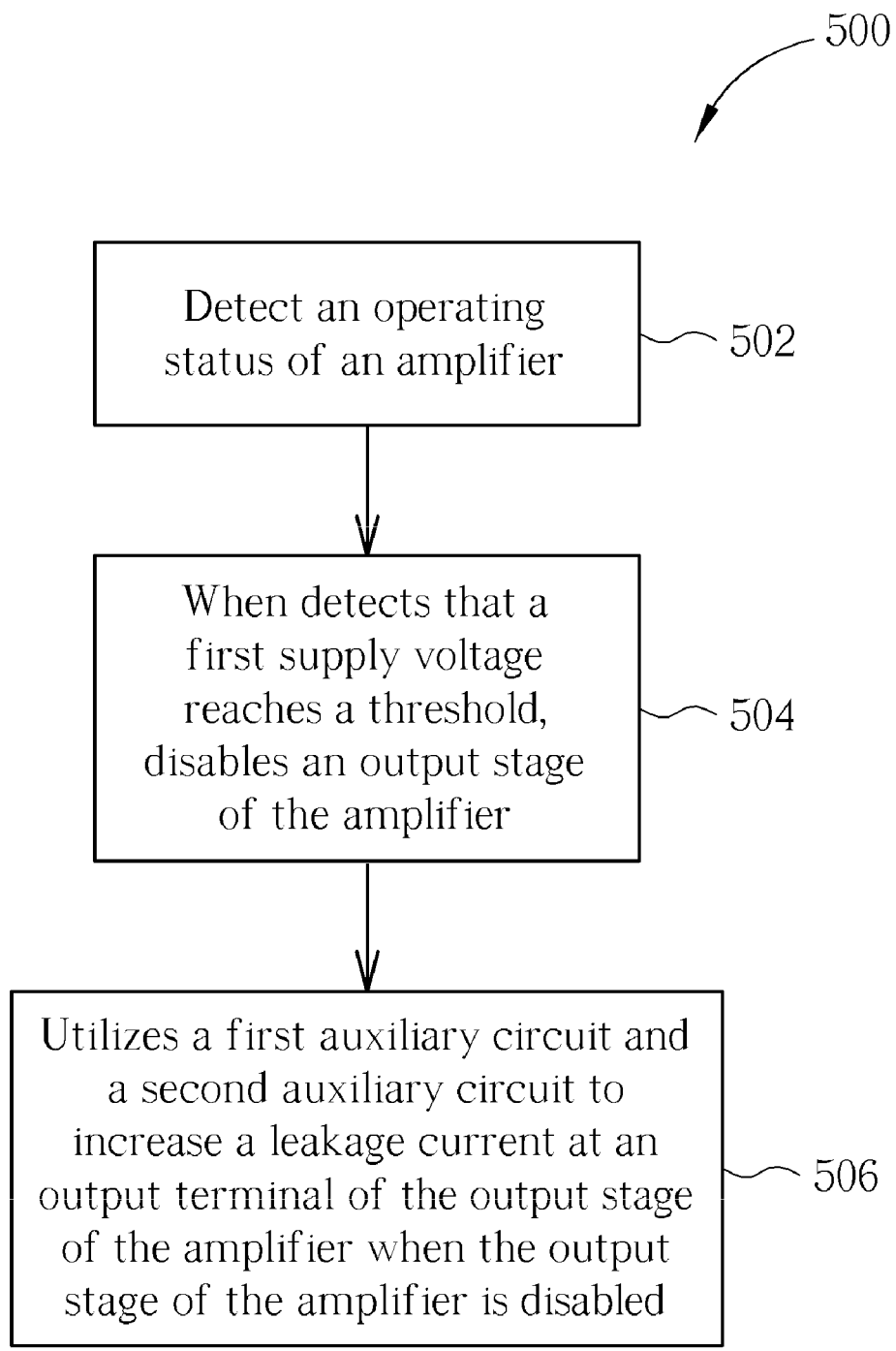
FIG. 5 is a flowchart illustrating a method for enhancing a glitch performance of an amplifier according to a fourth embodiment of the present invention.

Please refer to FIG. 5. FIG. 5 is a flowchart illustrating a method 500 for enhancing a glitch performance of an amplifier according to a fourth embodiment of the present invention. The method 500 is applicable any amplifying systems; however, the following disclosure of the method 500 is described in conjunction with the amplifying system 200 for brevity Provided that substantially the same result is achieved, the steps of the flowchart shown in FIG. 5 need not be in the exact order shown and need not be contiguous; that is, other steps can be intermediate. The method 500 comprises the following steps:

Step 502: Detect the operating status of the amplifier 202; for example, detect the voltage level of the first supply voltage VDD;

Step 504: When it is detected that the first supply voltage VDD reaches the threshold $V_{th}$, disable the output stage 2022 of the amplifier 202;

Step 506: Utilize the first auxiliary circuit 210 and the second auxiliary circuit 212 to increase the leakage current at the output terminal, i.e., the first terminal $N_1$, of the output stage 2022 of the amplifier 202 when the output stage 2022 of the amplifier 202 is disabled.

In step 502, the operating status of the amplifier 202 may be the normal operation mode or the shut down mode. When the amplifying system 200 is going to leave the normal operation mode and enter the shut down mode, the first supply voltage VDD of the amplifier 202 decreases gradually to turn off the amplifier 202. In step 504, when the first supply voltage VDD reaches the threshold $V_{th}$, the output stage 2022 of the amplifier 202 is disabled to float the output terminal of the output stage 2022, i.e., the first terminal $N_1$. In this way, the amplifier 202 has no driving ability to the output signal $V_o$. Therefore, the voltage level at the output terminal, i.e., the output signal $V_o$, of the amplifier 202 is independent to the voltage level of the supply voltage VDD. Then, if the voltage level at the output terminal is required to be pulled down faster, the first auxiliary circuit 210 and/or the second auxiliary circuit 212 are utilized to increase the leakage current at the output terminal, i.e., the first terminal $N_1$, of the output stage 2022 of the amplifier 202 in step 506. In other words, the first auxiliary circuit 210 and the second auxiliary circuit 212 control the slope of the output signal $V_o$ to eliminate the glitch signal. In this embodiment, the first auxiliary circuit 210 may comprise a resistive element coupled to the output terminal of the output stage 2022, and the second auxiliary circuit 212 may comprise an active element, such as the N-type field effect transistor $M_1$ or the N-type bipolar junction transistor $M_2$, coupled to the output terminal of the output stage 2022. Therefore, by moderating the slope of the output signal $V_o$, the pop-noise problem that emerges in the conventional amplifying method is solved.

Briefly, by integrating the first auxiliary circuit, the second auxiliary circuit, the detector, and the amplifier into a single chip, and disabling the output stage of the amplifier when the supply voltage of the amplifying system decreases to a threshold, the present invention not only provides an efficient way to eliminate the pop-noise, but also reduces the cost of the amplifying system.

Those skilled in the art will readily observe that numerous modifications and alterations of the device and method may be made while retaining the teachings of the invention.

What is claimed is:

1. An amplifying system, comprising:
an amplifier operated according to a supply voltage and configured to generate an audio signal to an audio playback device;
a detector coupled to the amplifier, for generating a first control signal to the amplifier to disable an output stage of the amplifier when the supply voltage is detected to reach a threshold; and
an auxiliary circuit coupled to an output terminal of the output stage in the amplifier and a specific voltage level, for increasing a leakage current at the output terminal when the output stage of the amplifier is disabled.

2. The amplifying system of claim 1, wherein the detector and the amplifier are configured in a single chip.

3. The amplifying system of claim 2, further comprising:
a capacitive device, external to the single chip and having a first terminal coupled to the output terminal of the output stage in the amplifier;
wherein the audio playback device is external to the single chip and coupled to a second terminal of the capacitive device.

4. The amplifying system of claim 1, wherein the auxiliary circuit, the detector, and the amplifier are configured in a single chip.

5. The amplifying system of claim 4, wherein the auxiliary circuit comprises a resistive element.

6. The amplifying system of claim 1, wherein the auxiliary circuit comprises a field effect transistor controlled by the detector, the field effect transistor has a control terminal coupled to the detector, a first terminal coupled to the output terminal of the output stage in the amplifier, and a second terminal coupled to the specific voltage level.

7. The amplifying system of claim 6, wherein the detector further generates the first control signal to the control terminal of the field effect transistor to enable the field effect transistor when the supply voltage is detected to reach the threshold.

8. The amplifying system of claim 1, wherein the auxiliary circuit comprises a bipolar junction transistor controlled by the detector, the bipolar junction transistor has a control terminal coupled to the detector, a first terminal coupled to the output terminal of the output stage in the amplifier, and a second terminal coupled to the specific voltage level.

9. The amplifying system of claim 8, wherein the detector further generates a second control signal to the control terminal of the bipolar junction transistor to drive the bipolar junction transistor when the supply voltage is detected to reach the threshold.

10. A method for enhancing a glitch performance of an amplifier, the amplifier operated according to a supply voltage and configured to generate an audio signal to an audio playback device, the method comprising:
detecting an operating status of the amplifier;
when detecting that the supply voltage reaches a threshold, disabling an output stage of the amplifier; and increasing a leakage current at an output terminal of the output stage in the amplifier when the output stage of the amplifier is disabled.

11. The method of claim 10, wherein the step of increasing the leakage current at the output terminal comprises:
coupling a resistive element to the output terminal.

12. The method of claim 10, wherein the step of increasing the leakage current at the output terminal comprises:
coupling an active element to the output terminal.

13. The method of claim 12, further comprising:
enabling the active element when detecting that the supply voltage reaches the threshold.

14. An amplifying system, comprising:
an amplifier operated according to a supply voltage and configured to generate an audio signal to an audio playback device;
a detector coupled to the amplifier, for adjusting an output signal of the amplifier when the supply voltage reaches a threshold; and
an auxiliary circuit coupled to an output terminal of an output stage of the amplifier and a specific voltage level, for increasing a leakage current at the output terminal when the output stage of the amplifier is disabled;
wherein the detector and the amplifier are configured in a single chip.

15. The amplifying system of claim 14, further comprising:
a capacitive device, external to the single chip and having a first terminal coupled to an output terminal of an output stage in the amplifier;
wherein the audio playback device is external to the single chip and coupled to a second terminal of the capacitive device.

16. The amplifying system of claim 14, wherein the detector adjusts the output signal of the amplifier by generating a first control signal to disable the output stage of the amplifier when the supply voltage reaches a threshold.

17. The amplifying system of claim 14, wherein the auxiliary circuit, the detector, and the amplifier are configured in the single chip.

* * * * *